United States Patent
Chen et al.

(10) Patent No.: US 8,311,666 B2
(45) Date of Patent: Nov. 13, 2012

(54) SYSTEM AND METHOD FOR SEPARATING DEFECTIVE DIES FROM WAFER

(75) Inventors: Te Chun Chen, Hsinchu County (TW); Chien Chao Huang, Hsinchu County (TW); Cheng Tao Tsai, Hsinchu County (TW)

(73) Assignee: Cheng Mei Instrument Technology Co., Ltd., Hsinchu County (TW)

( * ) Notice: Subject to any disclaimer, the term of this patent is extended or adjusted under 35 U.S.C. 154(b) by 230 days.

(21) Appl. No.: 12/648,234

(22) Filed: Dec. 28, 2009

(65) Prior Publication Data
US 2010/0166535 A1    Jul. 1, 2010

(30) Foreign Application Priority Data
Dec. 31, 2008   (TW) ............................... 97151582 A

(51) Int. Cl.
G01R 31/00    (2006.01)
G01R 31/20    (2006.01)
G06F 19/00    (2006.01)

(52) U.S. Cl. ........ 700/222; 700/110; 700/109; 700/108; 700/220; 324/500; 324/750.01; 324/750.16; 324/757.01; 324/757.04

(58) Field of Classification Search .................. None
See application file for complete search history.

(56) References Cited

U.S. PATENT DOCUMENTS
5,488,292 A * 1/1996 Tsuta ..................... 324/754.09
2009/0301395 A1* 12/2009 Sekimoto et al. ............. 118/668
* cited by examiner

*Primary Examiner* — Gene Crawford
*Assistant Examiner* — Yolanda Jones
(74) *Attorney, Agent, or Firm* — WPAT, P.C.; Anthony King

(57) ABSTRACT

A system separating defective dies from a wafer comprises a film frame platform and a pick-and-place device. The film frame platform comprises a support table assembly configured for supporting a film frame assembly and a platform surface configured to receive the placement of bins thereupon. The pick-and-place device is configured for moving in a linear manner between the support table assembly and the platform surface.

12 Claims, 8 Drawing Sheets

US 8,311,666 B2

SYSTEM AND METHOD FOR SEPARATING DEFECTIVE DIES FROM WAFER

BACKGROUND OF THE INVENTION

1. Field of the Invention

The present invention relates to a system for separating defective dies from a wafer and method thereof, and relates more particularly to a system and method that uses a linear pick-and-place mechanism to carry out pick-and-place operations between a wafer support table assembly and sorting bins, all of which are integrally disposed on a platform.

2. Description of the Related Art

In a typical die packaging process, if semiconductor dies are inspected using an automated optical inspection system between a wafer dicing process and a die sorting process, and the defective dies are removed during the die sorting process, then the yield of the die packaging process can be increased.

A traditional automated optical inspection system comprises a wafer inspection platform and a bin platform. Wafers are placed on the wafer inspection platform for inspection. Defective dies found during inspection are picked and placed in bins disposed on the bin platform using a swing arm mechanism.

However, in a traditional automated optical inspection system, the wafer inspection platform and the bin platform have independent driving apparatuses separate from one another, and for a control system, to simultaneously control two independent driving apparatuses is difficult and an operational delay may frequently occur with the operations of the two driving apparatuses. Moreover, each of the two movable platforms also requires a larger space. Furthermore, with the swing arm mechanisms common to traditional automated inspection systems, one main disadvantage is the requirement of more space for the movement of a swing arm mechanism, and slow speed is another main disadvantage. In addition to the above-mentioned drawbacks, the locations of inspected defective dies on a wafer map are currently marked manually. Manual marking is not only inefficient but also prone to errors.

Current traditional automated optical inspection systems do not have automatic loading and unloading functions for wafers and cannot arrange picked-and-placed dies orderly. Therefore, such systems are still inconvenient to use.

Traditional automated optical inspection systems require large spaces, are difficult to control, have low system stability, cannot automatically load and unload wafers, cannot neatly arrange picked-and-placed dies, and manually mark the locations of defective dies on a wafer map. Therefore, some aspects of such traditional automated optical inspection systems need to be modified.

SUMMARY OF THE INVENTION

The present invention provides a system and method for separating defective dies from a wafer, in which a support table assembly and bins are integrally disposed on a platform.

According to one embodiment of the present invention, a system for separating defective dies from a wafer comprises a film frame platform and a pick-and-place device. The film frame platform comprises a support table assembly and a platform surface adjacent to the support table assembly. The support table assembly is configured to support the film frame assembly. The platform surface is configured for the placement of the bin. The pick-and-place device is configured to move in a linear manner between the support table assembly and the platform surface.

According to another embodiment of the present invention, a method for separating defective dies from a wafer comprises the steps of: obtaining a defect map of a wafer in a film frame assembly, wherein a film frame platform comprises a support table assembly and a platform surface, and the film frame is supported by the support table assembly; and removing defective dies from the film frame assembly, according to the defect map, to a bin placed on the platform surface using a linear motion device.

BRIEF DESCRIPTION OF THE DRAWINGS

The invention will be described according to the appended drawings in which.

DETAILED DESCRIPTION OF THE INVENTION

Figure 1:
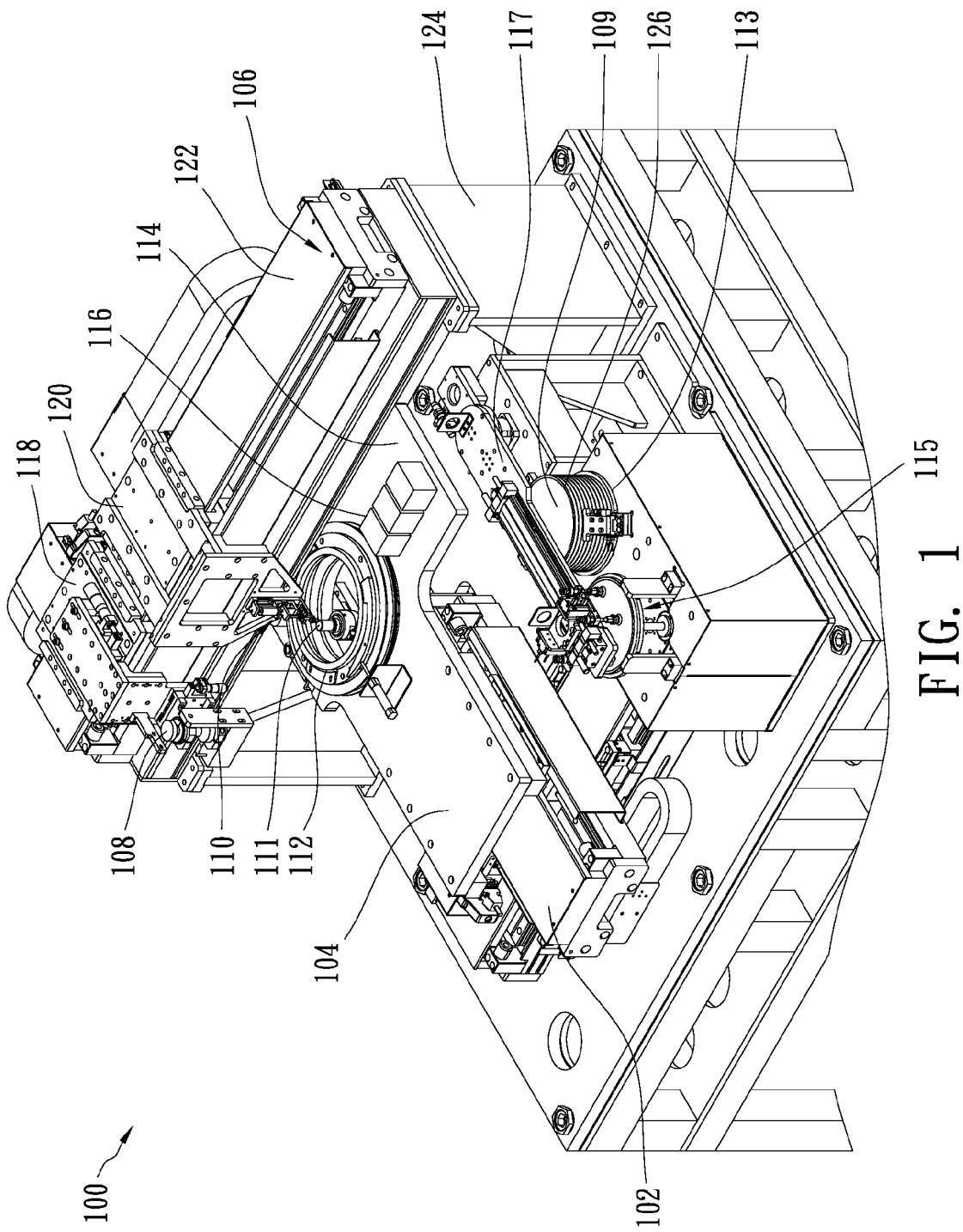
FIG. 1 is a perspective view illustrating a system for separating defective dies from a wafer according to the first preferred embodiment of the present invention.

FIG. 1 is a perspective view illustrating a system 100 for separating defective dies from a wafer according to the first preferred embodiment of the present invention. The system 100 for separating defective dies for a wafer comprises a second linear motion device 102, a film frame platform 104 attached to the second linear motion device 102, a first linear motion device 106 disposed in a zone above the film frame platform 104, an optical sensing device 108 attached to the first linear motion device 106, a pick-and-place device 110 attached to the first linear motion device 106, a die ejector 111, a loading station 113, an unloading station 115, a swing arm mechanism 117, and a control device (not shown) for controlling the system 100. The film frame platform 104 can move along a first direction by means of the second linear motion device 102. The film frame platform 104 comprises a support table assembly 112 configured to support a film frame assembly and a platform surface 114 adjacent to the support table assembly 112. The platform surface 114 is configured for the placement of at least one bin 116. Because the bins 116 are placed adjacent to the support table assembly 112, the displacement range of motion between the film frame assembly 109 and the bins 116 is reduced, and therefore, the speed of picking and placing a die by the system 100 can be increased. Further, one second linear motion device 102 is used to fulfill the operation requirements of the support table assembly 112 and the bin 116, and compared to prior art sorting systems, such an arrangement can largely reduce the space requirement of the system 100, simplify the control of the system 100, and increase the stability of the operation of the system 100. The film frame assembly 109 includes a combination of a diced wafer, film for immobilizing the diced wafer and film frame.

The first linear motion device 106 is configured to move the optical sensing device 108 and the pick-and-place device 110 along a second direction, wherein the first direction and the second direction can be mutually orthogonal. In the present embodiment, the first linear motion device 106 comprises sliding tables (118 and 120) and a linear motor 122. The optical sensing device 108 and the pick-and-place device 110 are disposed on the respective sliding tables 118 and 120. The sliding tables 118 and 120 are moved by means of the linear motor 122, which is supported by a supporting frame 124 and is located in a zone above the film frame platform 104.

The system 100 of the present invention has an automatic function of loading and unloading film frame assemblies 109 so that the speed of loading and unloading can be increased and the time needed to align a film frame assembly 109 can be reduced. The film frame assemblies 109 are contained within the loading station 113 in a stacked manner. The swing arm mechanism 117 transfers the stacked film frame assembly 109 one after another in sequence onto the support table assembly 112. After processes of inspection and pick-and-place are completed, the swing arm mechanism 117 transfers the inspected film frame assembly 109 on the support table assembly 112 to the unloading station 115.

Figure 2:
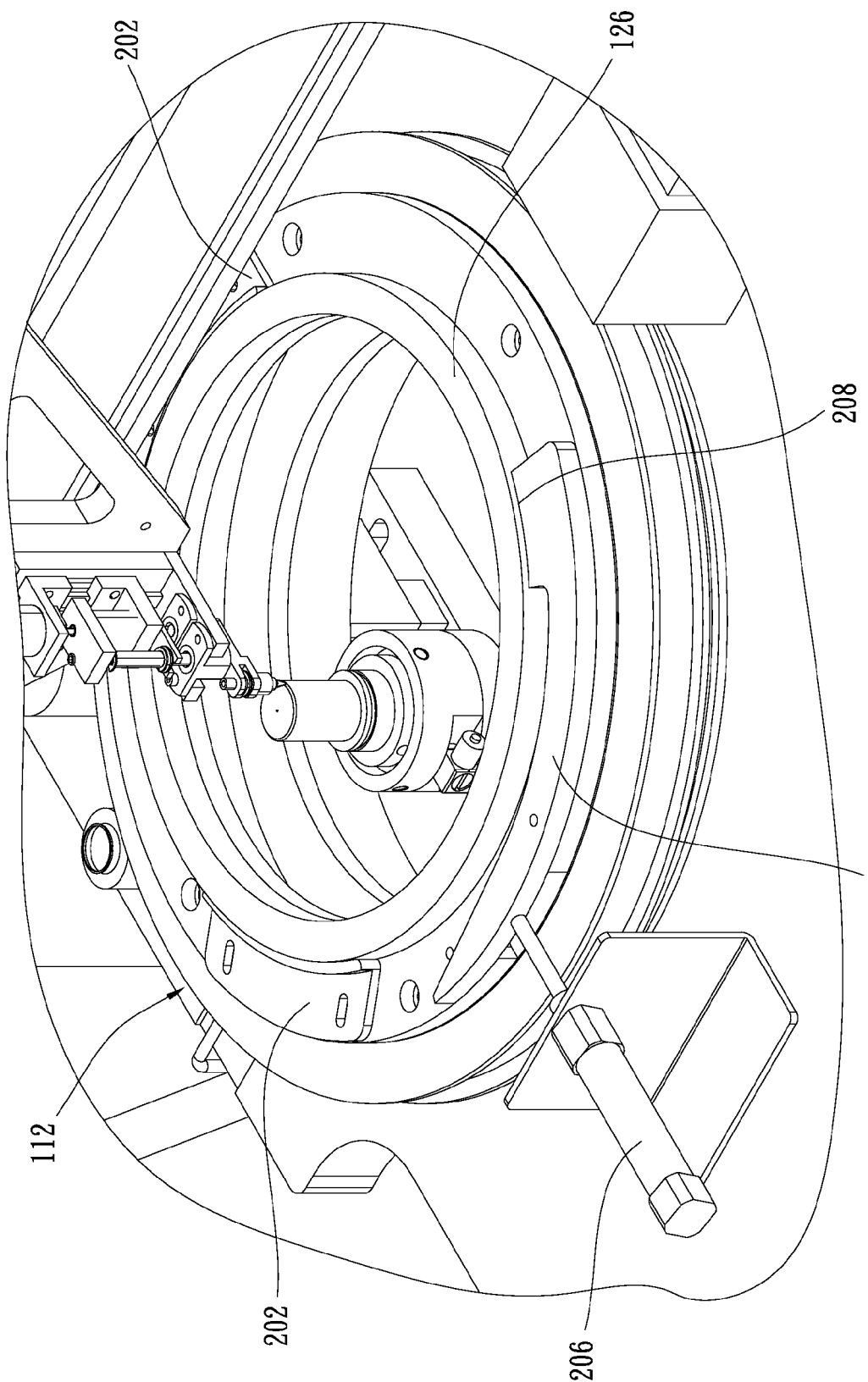
FIG. 2 is a perspective view showing a support table assembly according to one embodiment of the present invention.

FIG. 2 is a perspective view showing a support table assembly 112 according to one embodiment of the present invention. Referring to FIGS. 1 and 2, a wafer ring 126 is peripherally disposed around the film frame assembly 109. When the film frame assembly 109 is placed on the support table assembly 112, at least one stationary clamping member 202 and a movable clamping member 204 are used to firmly hold the film frame assembly 109. In the movable clamping member 204, a clamping portion 208 is moved by a pneumatic cylinder 206 based on the levering principle such that the clamping portion 208 can firmly attach to or detach from the wafer ring 126. The film frame platform 104 can also comprise a rotation device (not shown) configured to compensate the angular error of the film frame assembly 109 on the support table assembly 112.

Figure 3:
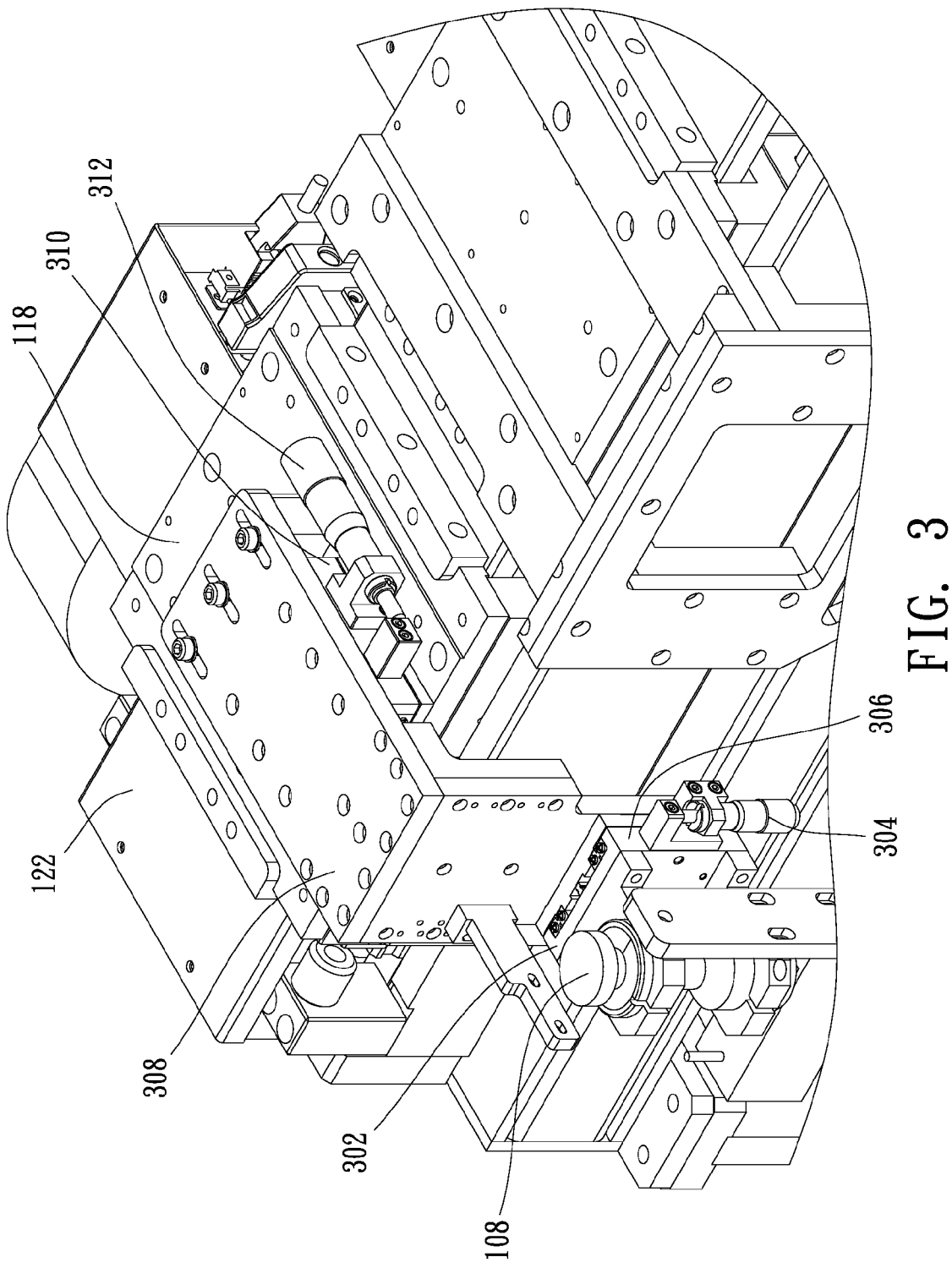
FIG. 3 is a perspective view showing an optical sensing device and the motion and adjustment mechanism thereof according to one embodiment of the present invention.

FIG. 3 is a perspective view showing an optical sensing device 108 and the motion and adjustment mechanism thereof according to one embodiment of the present invention. Referring to FIGS. 1 and 3, the optical sensing device 108 is located beside the linear motor 122 and is attached to a slide stage 302, at one side of which a fine adjustment assembly 304 is provided to move the slide table 306 of the slide stage 302 along the vertical direction for fine adjustment. The slide stage 302 is attached to one side of an L-shaped member 308, and the other side of the L-shaped member 308 is connected onto the sliding table 118, which is moved by the linear motor 122. Between the sliding table 118 and the L-shaped member 308, a slide stage 310 and a fine adjustment assembly 312 is provided so that the optical sensing device 108 can be finely adjusted along the above-mentioned first direction. The optical sensing device 108 is configured to obtain images used for inspecting surface defects, compensating a position error and an angular error of the film frame assembly 109, and calculating the coordinates of dies. The optical sensing device 108 can comprise an imaging sensor, which may be a charge-coupled device image sensor or a complementary metal-oxide semiconductor sensor.

Figure 4:
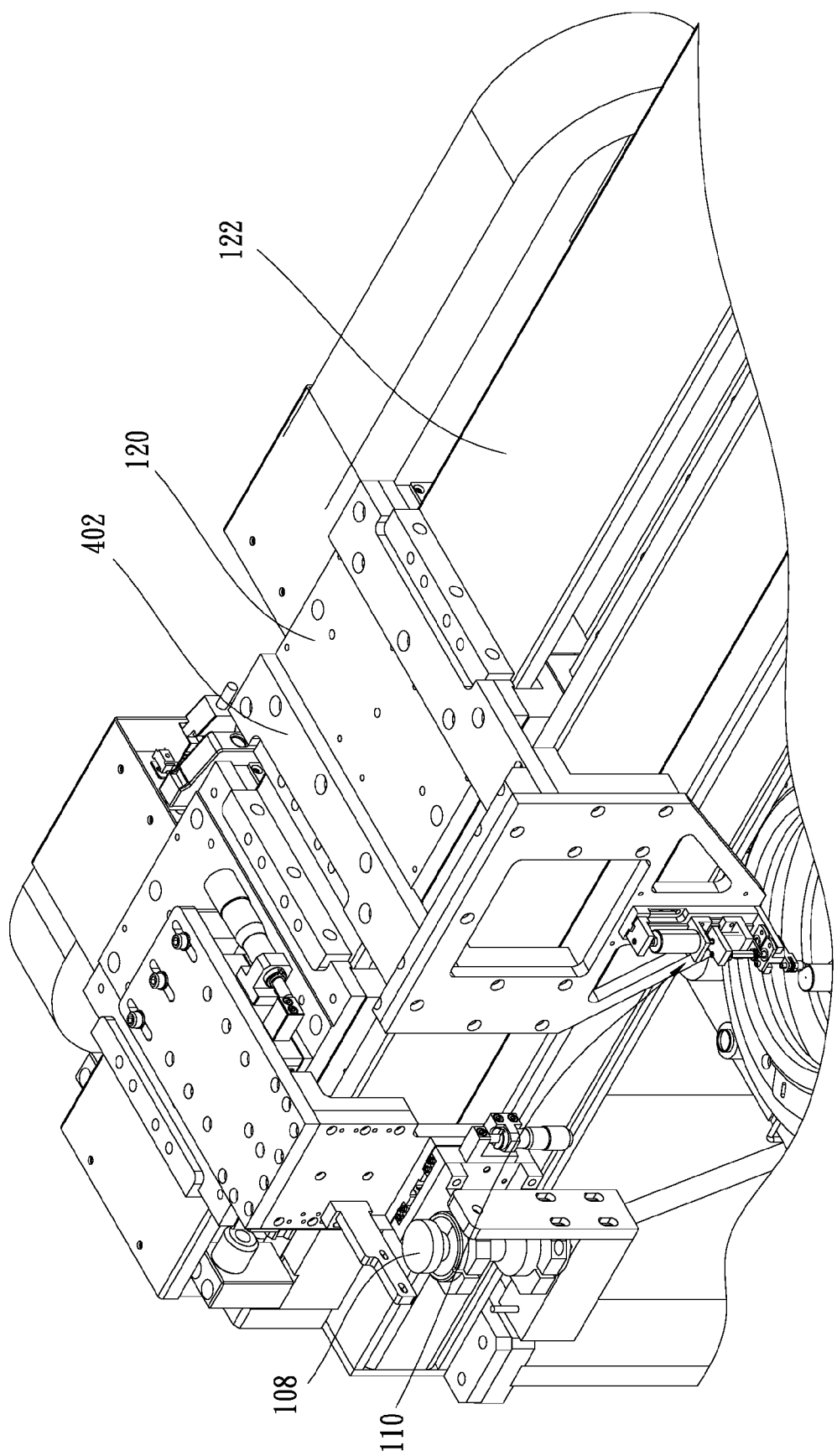
FIG. 4 is a perspective view showing a pick-and-place device and the motion and adjustment mechanism thereof according to one embodiment of the present invention.

FIG. 4 is a perspective view showing a pick-and-place device 110 and the motion and adjustment mechanism thereof according to one embodiment of the present invention. The pick-and-place device 110 is located beside the linear motor 122 and is attached to the sliding table 120 using a supporting member 402. The optical sensing device 108 and the pick-and-place device 110 are all moved by the same linear motor 122 so as to save an occupied space and increase control stability. An anti-collision distance can be set up between the optical sensing device 108 and the pick-and-place device 110, and the distance can be monitored using a software program.

Figure 5:
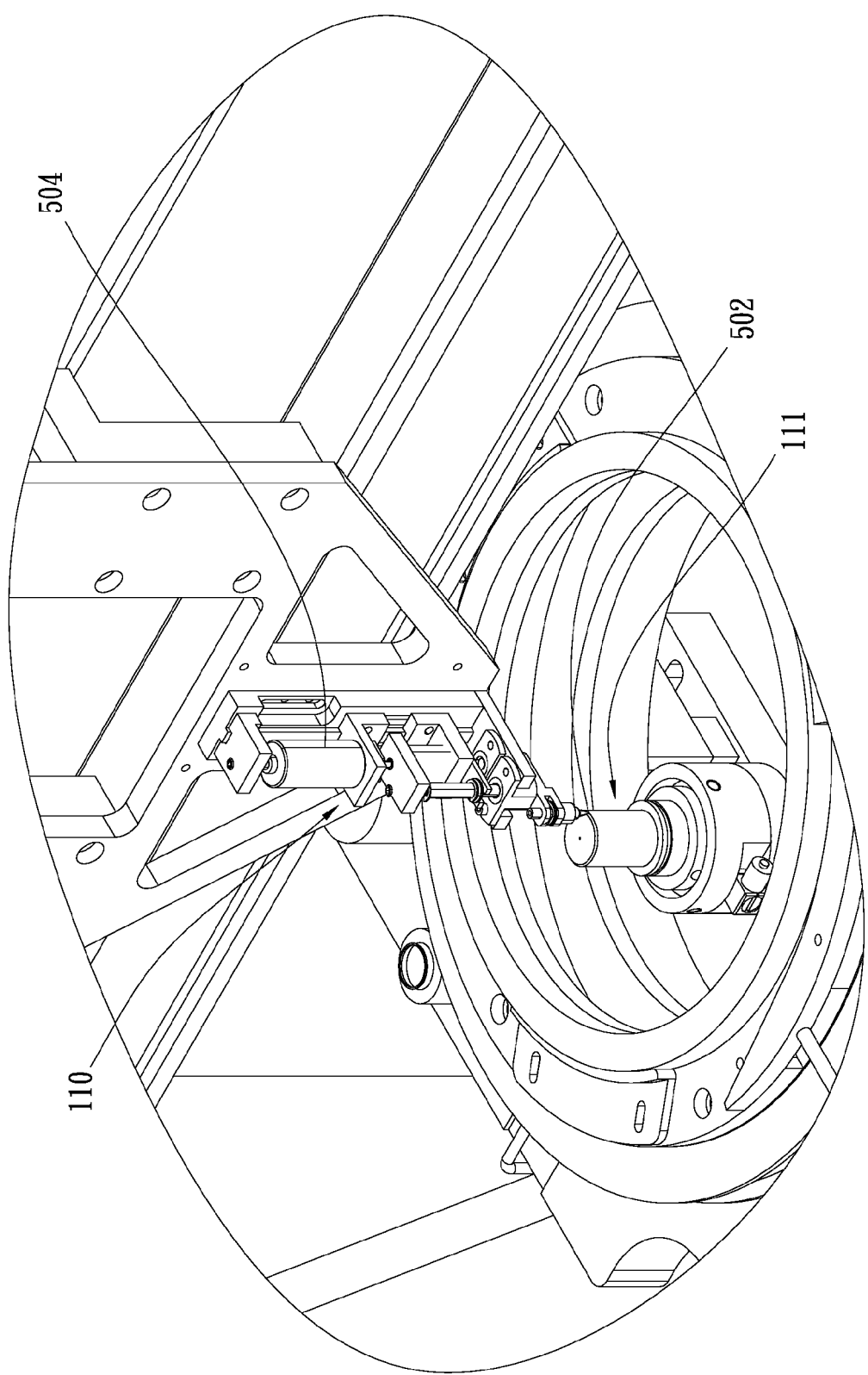
FIG. 5 is a perspective view showing a pick-and-place device and a die ejector according to one embodiment of the present invention.

FIG. 5 is a perspective view showing a pick-and-place device 110 and a die ejector 111 according to one embodiment of the present invention. Referring to FIGS. 1 and 5, the die ejector 111 disposed below the support table assembly 112 is configured to make dies on a film partially detach from the film using a pin such that the pick-and-place device 110 can easily pick up these dies. The pin can be driven vertically using a stepping motor. The pick-and-place device 110 may comprise a nozzle assembly 502 and a solenoid drive device 504 configured to move the nozzle assembly 502 vertically. The nozzle assembly 502, moving by positive and negative pressure control in coordination, can smoothly pick up dies from the film. Referring to FIG. 1 again, because the displacement range of motion between the film frame assembly 109 and the bin 116 is short and a high speed linear motor 122 is used to drive the pick-and-place device 110, the system 100 of the present invention can have the advantage of high throughput.

Figure 6:
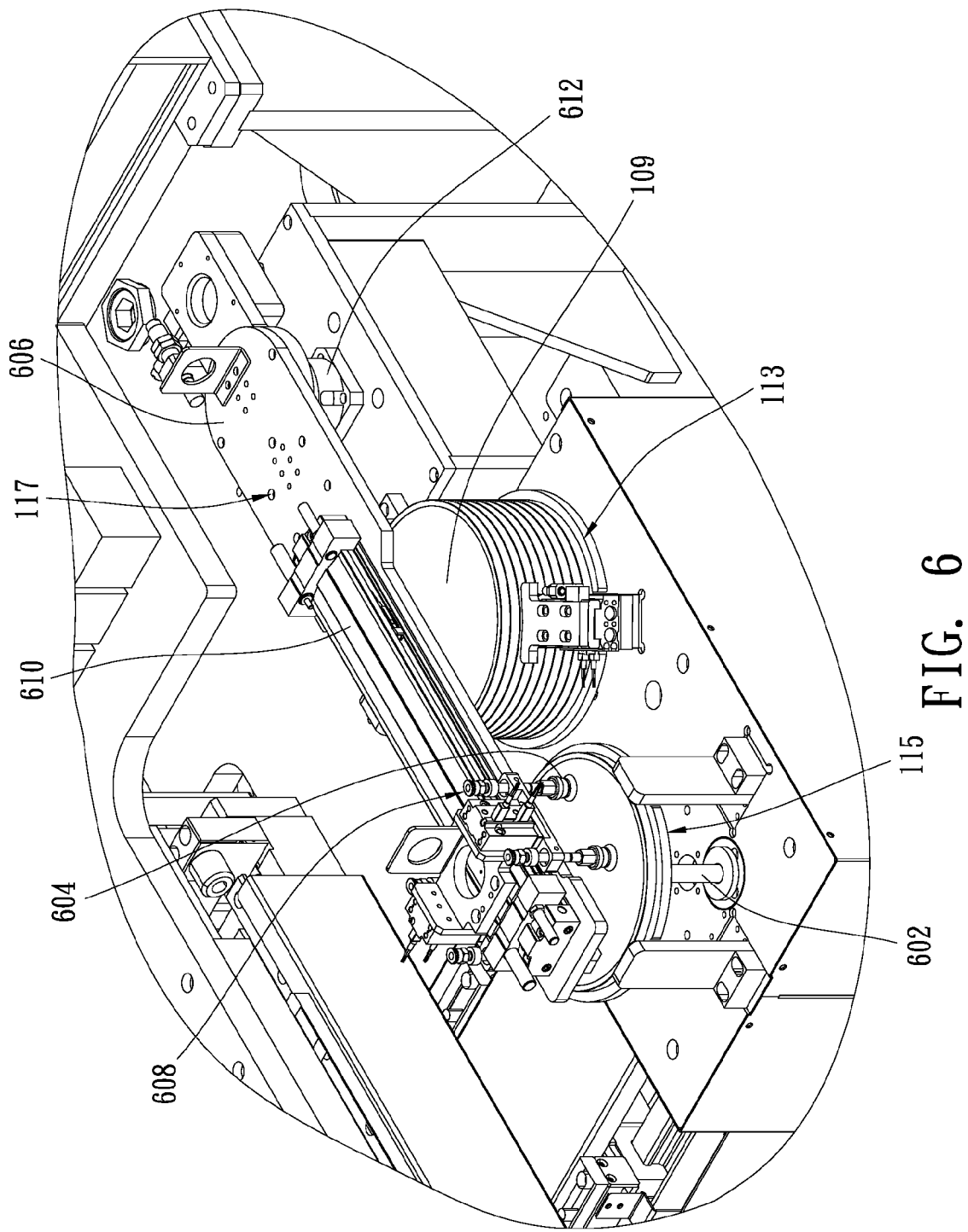
FIG. 6 is a perspective view showing a loading station and an unloading station according to one embodiment of the present invention.

FIG. 6 is a perspective view showing a loading station and an unloading station according to one embodiment of the present invention. Referring to FIGS. 1 and 6, the loading station 113 and the unloading station 115 of the present invention can contain a plurality of stacked film frame assemblies 109 such that die inspection can be performed continuously to increase the throughput of the system 100. The swing arm mechanism 117 can transfer film frame assemblies 109 onto the support table assembly 112 in sequence, and the loading station 113 including a vertical motion mechanism 602 like that of the unloading station 115 can make the plurality of nozzles 604 contact each film frame assembly 109. The swing arm mechanism 117 may comprise a swing arm 606, a motion device 610 disposed on one end of the motion device 610, a nozzle device 608 disposed on the motion device 610, and a rotation device 612 configured for swing use and disposed on the other end of the swing arm 606. The nozzles 604 can move in and out of the loading station 113 and the unloading station 115 using the motion device 610.

Figure 7:
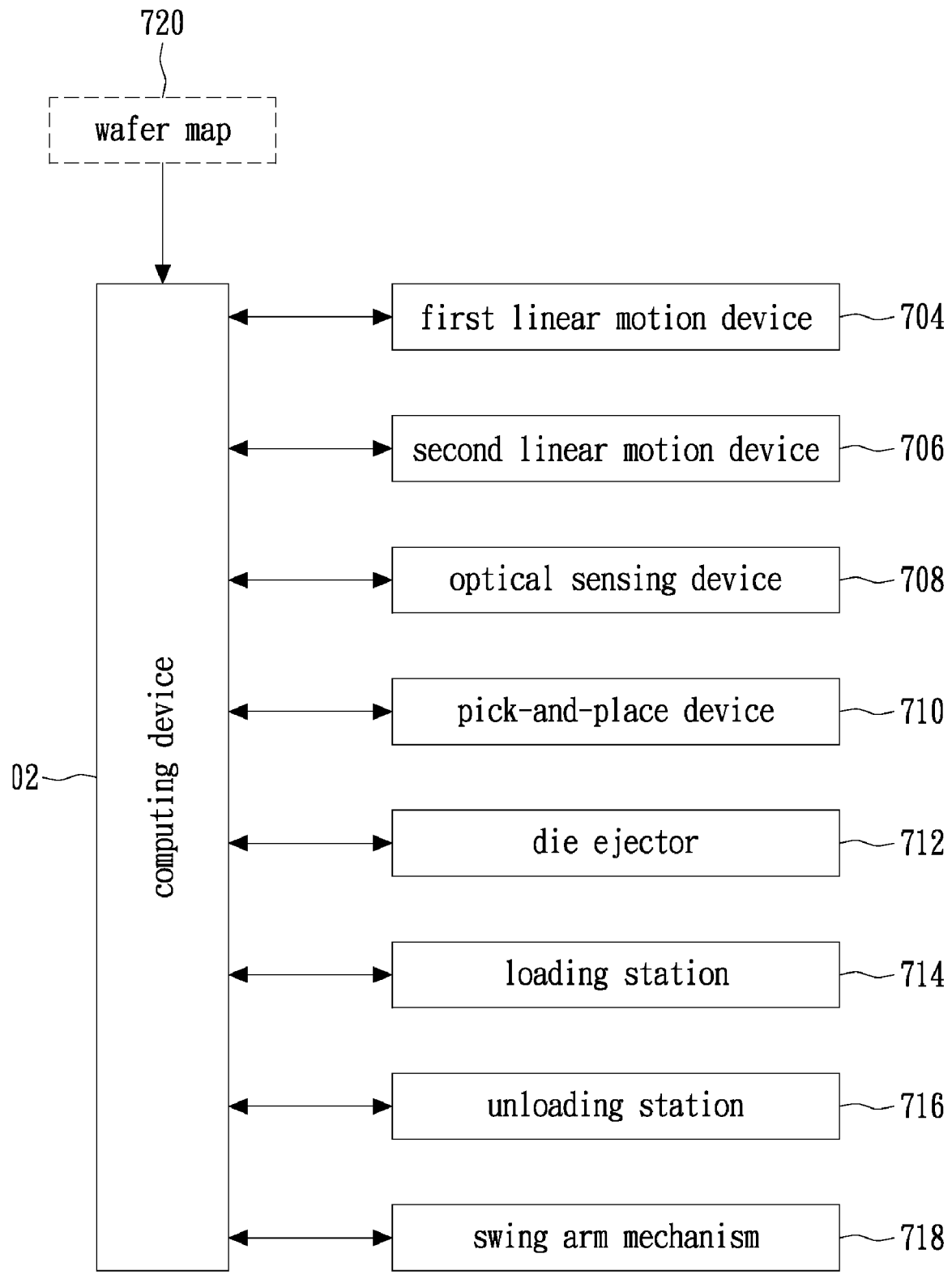
FIG. 7 is a schematic block diagram of a system control according to one embodiment of the present invention.

FIG. 7 is a schematic block diagram of a system control according to one embodiment of the present invention. The system 100 for separating defective dies from a wafer may further comprise a computing device 702, which is configured to control the first linear motion device 704, the second linear motion device 706, the optical sensing device 708, a pick-and-place device 710, a die ejector 712, a loading station 714, an unloading station 716, and swing arm mechanism 718 so that the above-described devices and mechanisms can work in a coordinated manner. The above-described devices and mechanisms can have their own driving devices. The computing device 702 can receive a wafer map from a wafer probing test machine and automatically update the wafer map 720 with a defect map of a wafer in a film frame assembly after the defect map is generated. Thereafter, the updated wafer map can be used in a die sort process.

Figure 8:
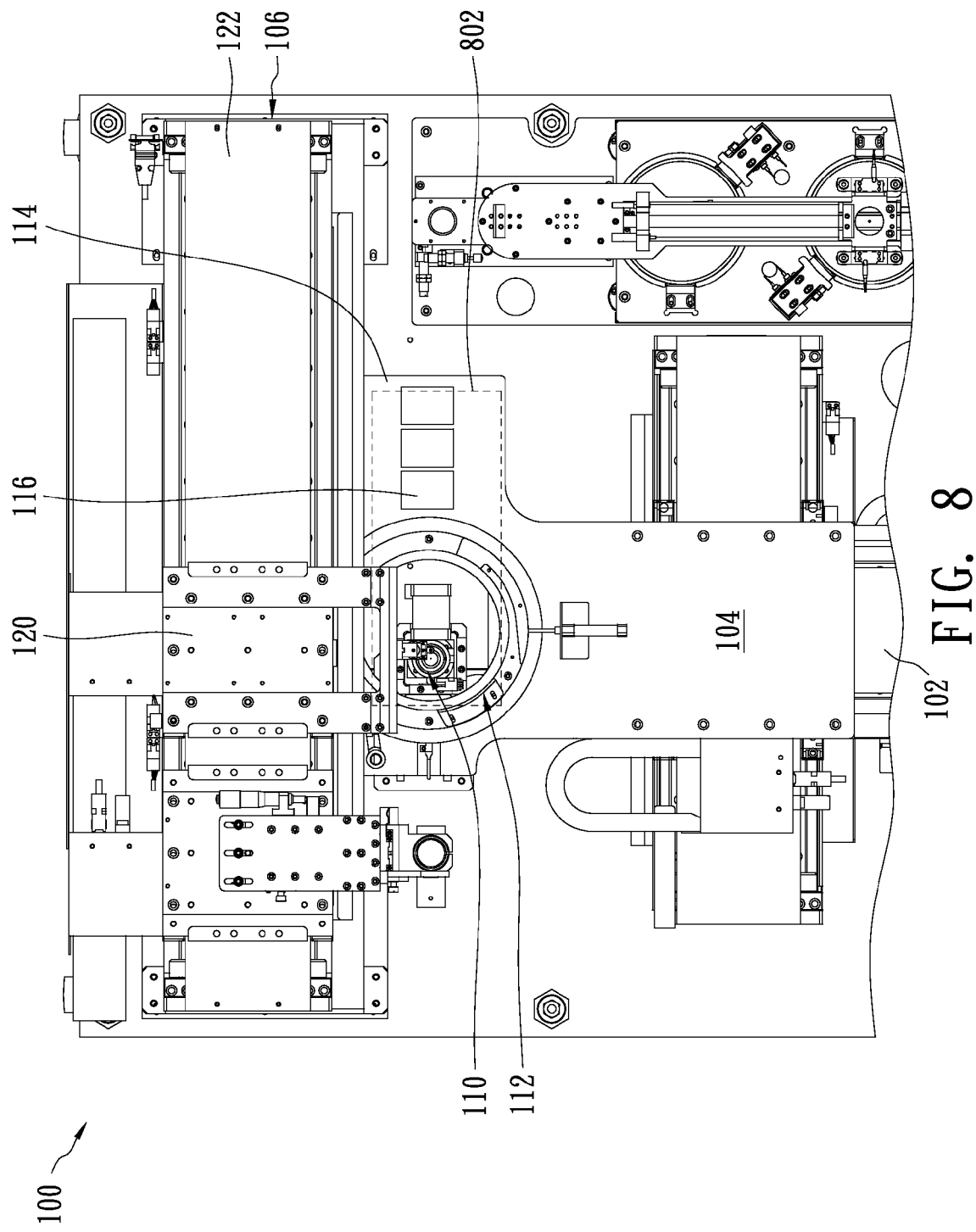
FIG. 8 shows a displacement range of motion of the pick-and-place device according to one embodiment of the present invention.

FIG. 8 shows a displacement range of motion 802 of the pick-and-place device 110 according to one embodiment of the present invention. In the present embodiment, the first linear motion device 106 moves the pick-and-place device 110 in a linear manner so that dies can be picked and placed very quickly. The pick-and-place device 110 moves within a displacement range of motion 802, which covers the area of the support table assembly, the area of the platform surface, and the area between the support table assembly and the platform surface. In one embodiment, the displacement range of motion 802 can be a rectangular area of 200 millimeters in length and 150 millimeters in width. The performance of the system 100 can be evaluated using a periodic time interval. The periodic time interval is equal to the time in which a defective die is picked up by the pick-and-place device 110, and then the defective die is placed into a bin 116, and finally the pick-and-place device 110 moves to the next defective die. In the present embodiment, the periodic time interval of the pick-and-place device 110 moving within the displacement range of motion is less than 0.35 seconds.

The present invention provides a method for separating defective dies from a wafer. The method initially transfers a film frame assembly from a loading station to a support table assembly using a swing arm mechanism. Next, the film frame assembly is located and rotated for its angular-error compensation. After the film frame assembly is placed on the support table assembly, the position and angular errors of dies are measured using an optical sensing device. The angular error is compensated using a rotation device to rotate the film frame assembly, and the position error of each die is compensated while the die is being picked. Next, the film frame assembly is scanned to obtain a defect map. Thereafter, a computing device calculates the coordinates of each defective die of the film frame assembly using the defect map. Next, each defective die is picked and placed by driving the pick-and-place device according to its coordinates. Because the film used in the film frame assembly is elastic and soft, the film will deform after several cycles of pick-and-place operation. As such, the position of dies left on the film will shift. Therefore, the location of each die on the film is required to be compensated after several pick-and-place operations. In the present embodiment, dies on the film frame assembly can be divided into several groups. Each group can be assigned a datum point. When defective dies in one group of dies are completely removed, the displacement of the datum point of the next group is measured using the optical sensing device. Consequently, the coordinates of each die in the next group is compensated with the displacement of the datum point. The pick-and-place operation is well-known to persons skilled in the art so the steps thereof are not described in detail herein. Next, the computing device updates a wafer map of the processing film frame assembly with the defect map, and calculates the yield of the wafer in the film frame assembly for the die sorting process. Finally, the swing arm mechanism transfers the inspected film frame assembly to the unloading station.

The system of the present invention can be applied to any semiconductor product, although the system is preferred for light emitting diodes. The system and disclosed method of the present invention can not only remove defective dies on a wafer, but also can test each die to determine its bin code, and all dies can be placed into different bins in the system according to their bin codes.

The above-described embodiments of the present invention are intended to be illustrative only. Numerous alternative embodiments may be devised by persons skilled in the art without departing from the scope of the following claims.

What is claimed is:

1. A system for separating defective dies from a wafer, the system comprising:
    a film frame platform comprising a support table assembly and a platform surface adjacent to the support table assembly, the support table assembly configured to support a film frame assembly, the film frame assembly including a film and a diced wafer attached to the film, and the platform surface configured to place a bin;
    a pick-and-place device configured to move in a linear manner between the support table assembly and the platform surface to pick and place a defective die from the diced wafer to the bin; and
    a die ejector disposed below the support table assembly and configured to partially detach the defective die from the film.

2. The system of claim 1, further comprising a first linear motion device disposed in a zone above the film frame platform and configured to move the pick-and-place device in a linear manner.

3. The system of claim 2, further comprising a second linear motion device configured to move the film frame platform.

4. The system of claim 3, wherein motion directions of the first linear motion device and the second linear motion device are mutually orthogonal.

5. The system of claim 2, wherein the first linear motion device comprises two sliding tables and a linear motor configured to drive the two sliding tables, and the pick-and-place device is attached to one of the two sliding tables.

6. The system of claim 5, further comprising an optical sensing device configured to provide a defect map and attached to the other sliding table.

7. The system of claim 6, further comprising a computing device configured to update a wafer map of the film frame assembly with the defect map.

8. The system of claim 6, wherein the optical sensing device comprises an imaging sensor, the imaging sensor is a charge-coupled device image sensor or a complementary metal-oxide semiconductor sensor.

9. The system of claim 1, further comprising:
    a loading station configured to contain film frame assemblies waiting for inspection;
    an unloading station configured to contain inspected film frame assemblies; and
    a swing arm mechanism including a swing arm, a motion device and a nozzle, wherein the nozzle is attached to the motion device so that the nozzle moves between the loading station and the unloading station, and the swing arm causes the nozzle to move between the support table assembly and the loading station or the unloading station.

10. The system of claim 9, wherein each of the loading station and the unloading station further comprises a vertical motion mechanism for handling a stack of the film frame assemblies.

11. The system of claim 1, wherein the support table assembly further comprises at least one stationary clamping member and a movable clamping member, and the stationary clamping member and the movable clamping member are configured to hold the film frame assembly.

12. The system of claim 1, further comprising a displacement range of motion, wherein the displacement range of motion covers an area of the support table assembly, an area of the platform surface, and an area between the support table assembly and the platform surface, and the periodic time interval in which the pick-and-place device moves within the displacement range of motion is less than 0.35 seconds.

* * * * *